(12) United States Patent
Ning

(10) Patent No.: US 7,479,699 B2
(45) Date of Patent: Jan. 20, 2009

(54) SEAL RING STRUCTURES WITH UNLANDED VIA STACKS

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/611,391

(22) Filed: Dec. 15, 2006

(65) Prior Publication Data

US 2007/0145567 A1 Jun. 28, 2007

(30) Foreign Application Priority Data

Dec. 22, 2005 (CN) .................... 2005 1 0111999

(51) Int. Cl.
*H01L 23/48* (2006.01)
(52) U.S. Cl. .................. 257/751; 257/750; 257/758; 257/753; 257/E23.142; 257/E23.145; 257/E23.16; 257/E23.168; 257/E23.169
(58) Field of Classification Search ......... 257/678–733, 257/E21.01–E23.194, 774, 621, 751, 627, 257/643, 653, 750, 753
See application file for complete search history.

(56) References Cited

U.S. PATENT DOCUMENTS

| | | | |
|---|---|---|---|
| 4,972,253 A * | 11/1990 | Palino et al. ................ 257/691 |
| 6,028,347 A | 2/2000 | Sauber et al. | |
| 6,362,524 B1 | 3/2002 | Blish et al. | |
| 6,412,786 B1 | 7/2002 | Pan | |
| 6,509,622 B1 | 1/2003 | Ma et al. | |
| 6,537,849 B1 * | 3/2003 | Tsai et al. ................ 438/106 |
| 6,943,063 B2 * | 9/2005 | Tsai et al. ................ 438/118 |
| 6,951,801 B2 * | 10/2005 | Pozder et al. ............. 438/462 |
| 7,019,400 B2 * | 3/2006 | Iguchi et al. .............. 257/758 |

* cited by examiner

*Primary Examiner*—Jasmine J Clark
(74) *Attorney, Agent, or Firm*—Townsend and Townsend and Crew LLP

(57) ABSTRACT

Techniques for an integrated circuit device are provided. The integrated circuit device includes a semiconductor substrate, an integrated circuit, a dielectric layer, and a sealing structure. The sealing structure surrounds the integrated circuit and is disposed within the dielectric layer to prevent damage to the integrated circuit. The sealing structure includes a plurality of metal traces organized in vertical layers and a plurality of vias. Each via of the plurality of vias couples at least two metal traces of the plurality of metal traces from adjacent vertical layers. Each via of the plurality of vias contacts at least two orthogonal surfaces of a lower metal trace of the at least two metal traces. The plurality of metal traces and plurality of vias form a continuous boundary.

28 Claims, 3 Drawing Sheets

SEAL RING STRUCTURES WITH UNLANDED VIA STACKS

CROSS-REFERENCES TO RELATED APPLICATIONS

This application claims priority to Chinese Application No. 2005-10111999.8, filed on Dec. 22, 2005; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures to reduce film delamination in a multilayered structure. Merely by way of example, the invention has been applied to the manufacture of advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

For example, manufacturing processes often subject an integrated circuit to stresses. An integrated circuit can be exposed to environmental and mechanical stresses (such as during a sawing process), thereby causing multilayered structures of a chip to crack and/or delaminate. This problem is especially pronounced at interfaces that included materials having significantly different thermal expansion properties, such as between a low k dielectric material and copper. As a specific example, a conventional seal ring, being a protective barrier for an active region of an integrated circuit device, is subjected to mechanical and environmental stresses. Accordingly, conventional seal rings are prone to delamination or cracking. Delamination of a conventional seal ring often begins at an interface between a via and an underlying metal layer. These and other limitations may be found throughout the present specification and more particularly below.

From the above, it is seen that an improved technique for semiconductor devices is desired.

BRIEF SUMMARY OF THE INVENTION

According to the present invention, techniques directed to integrated circuits and their processing for the manufacture of semiconductor devices are provided. More particularly, the invention provides a method and device to reduce film delamination in a multilayered structure. Merely by way of example, the invention has been applied to an integrated circuit device. But it would be recognized that the invention has a much broader range of applicability.

In a specific embodiment, the present invention provides an integrated circuit device. The device includes a semiconductor substrate, an integrated circuit, a dielectric layer, and a sealing structure. The sealing structure surrounds the integrated circuit and is disposed within the dielectric layer to prevent damage to the integrated circuit. The sealing structure includes a plurality of metal traces organized in vertical layers and a plurality of vias. Each via of the plurality of vias couples at least two metal traces of the plurality of metal traces from adjacent vertical layers. Each via of the plurality of vias contacts at least two orthogonal surfaces of a lower metal trace of the at least two metal traces. The plurality of metal traces and plurality of vias form a continuous boundary in the dielectric layer.

In another embodiment, the sealing structure includes a first metal trace and a second metal trace. The second metal trace underlies at least a portion of the first metal trace. A via couples the first metal trace to the second metal trace. In particular, the via is coupled to a first surface of the second metal trace and a second surface of the second metal trace. The first surface and the second surface are orthogonal.

In yet another embodiment, an integrated circuit device includes a semiconductor substrate, an integrated circuit, and a sealing structure disposed around the integrated circuit. The sealing structure has a first metal trace and a second metal trace. The second metal trace underlies the first metal trace. A via is disposed between the first metal trace and second metal trace. A portion of the via disposed beyond a distal surface of the second metal trace and below a top surface of the second metal trace. The via couples a bottom surface of the first metal trace to both the top surface and the distal surface of the second metal trace.

Many benefits are achieved by way of the present invention over conventional techniques. For example, the present technique provides an easy to implement structure that relies upon conventional technology. Additionally, the techniques are compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. More particularly, the invention provides a method and device to reduce film delamination in a multilayered structure. Merely by way of example, the invention has been applied to an integrated circuit device. But it would be recognized that the invention has a much broader range of applicability.

Figure 1:
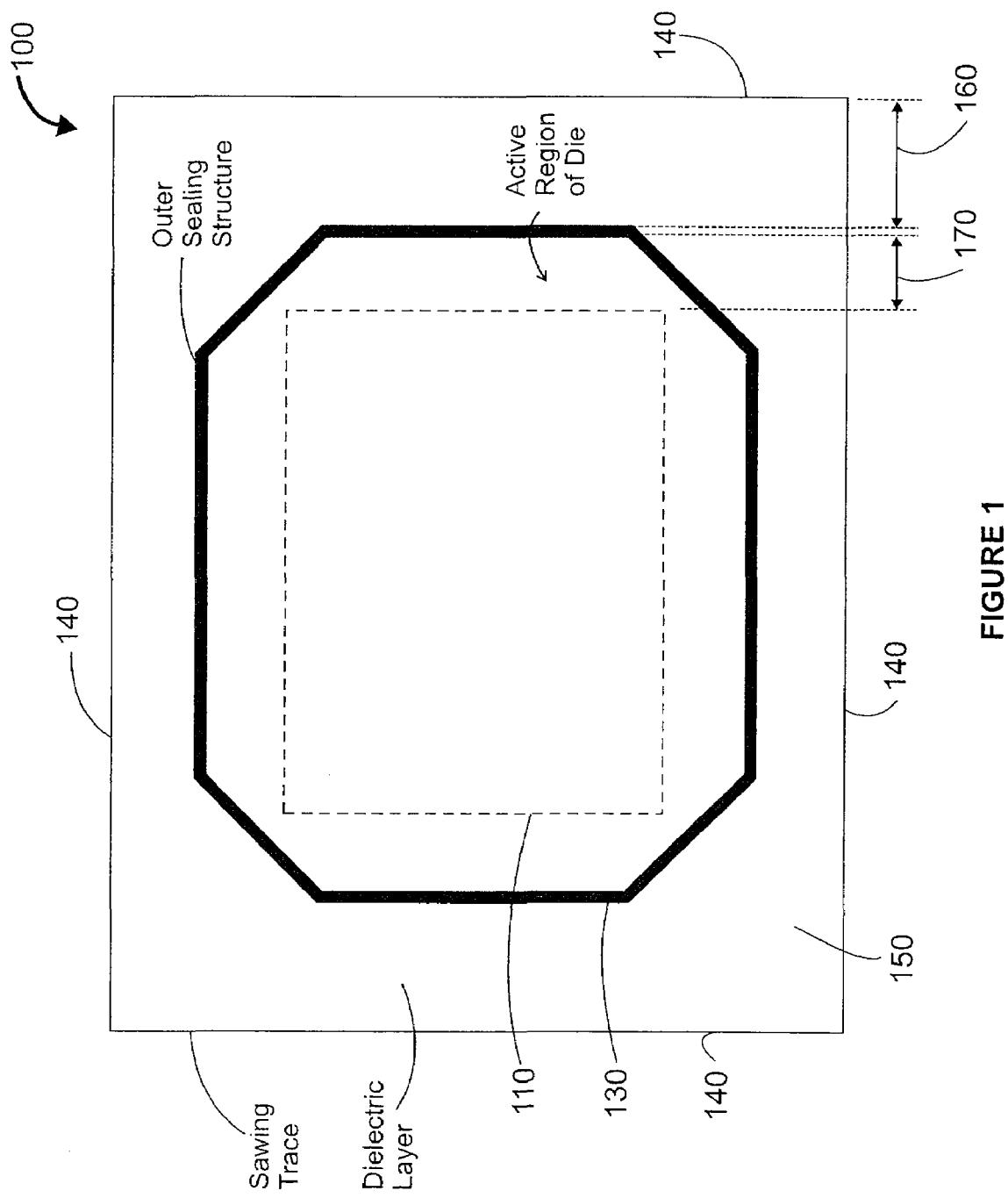
FIG. 1 is a simplified diagrams illustrating an integrate circuit device according to an embodiment of the present invention.

FIG. 1 illustrates an integrated circuit device 100 according to an embodiment of the present invention. This diagram is merely an example, which should not unduly limit the scope of the claims. One of ordinary skill in the art would recognize many variations, alternatives, and modifications.

Integrate circuit device 100 includes a semiconductor substrate and an overlying dielectric layer 150. An integrated circuit is disposed within an active region 110. Components of the integrated circuit (such as, transistors, diodes, resistors, capacitors, and the like) can be damaged by mechanical, electrical, and environmental stresses. For example, a sawing process to singulate integrate circuit device 100 from a wafer often induces delamination, cracking or chipping of integrated circuit devices, thus reducing manufacturing yield and device reliability. Dielectric layer 150 is a low k dielectric, such as plasma enhanced chemical vapor deposition (PECVD) silicon oxide, silicon nitride, silicon oxynitride, silicon carbide, flowable oxide (FOX), boron phosphorous silicon glass (BPSG), borosilica glass (BSG), polysilica glass (PSG), carbon doped silicon oxide, Black Diamond™ low k film from Applied Materials, Inc., Corel CVD dielectric from Novellus Systems Inc., SiLK dielectric resin from The Dow Chemical Company, or Aurora™ low-k dielectric from ASM International N.V. Dielectric layer 150 alone generally provides insufficient protection for components disposed within active region 100.

Integrated circuit device 100 has a sealing structure 130. Sealing structure 130 surrounds active region 110 to provide a protective wall. Sealing structure 130 is disposed between a sawing trace 140 and active region 110, thus insulating active region 110 from stress associated with the sawing process and the external environment. Sealing structures can take any arbitrary shape. For example, a sealing structure may be a square, rectangle, rounded corner rectangle, oval, circle, or polygon. In the example illustrated in FIG. 1, sealing structure 130 is a polygon. In an alternative embodiment, an integrated circuit device can include two sealing structures (e.g., inner and outer sealing structures) or a plurality of sealing structures (e.g., 3, 4, or more).

In addition, integrated circuit device 100 can include protective regions of dielectric layer 150 to reduce shock or damage. For example, sealing structure 130 is disposed a length 160 away from sawing trace 140 to reduce the possibility of damage to sealing structure 130 during the sawing process. Length 160 can range from at least about 0 microns to about 10 microns, or more. Sealing structure 130 is also disposed a length 170 away from active region 110. Length 170 is at least one micron or more. The region between sealing structure 130 and active region 110 serves as a buffer region.

Figure 2A:
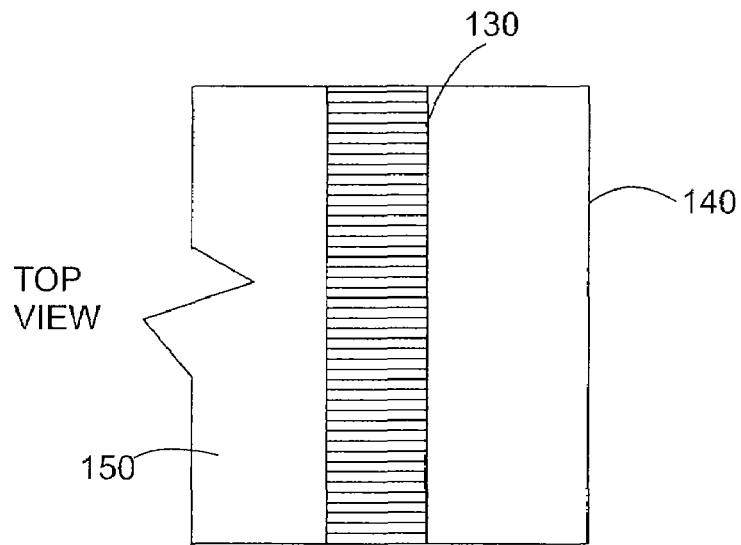
FIGS. 2A-2C illustrate simplified diagrams of a seal structure according to an embodiment of the present invention.
Figure 2B:
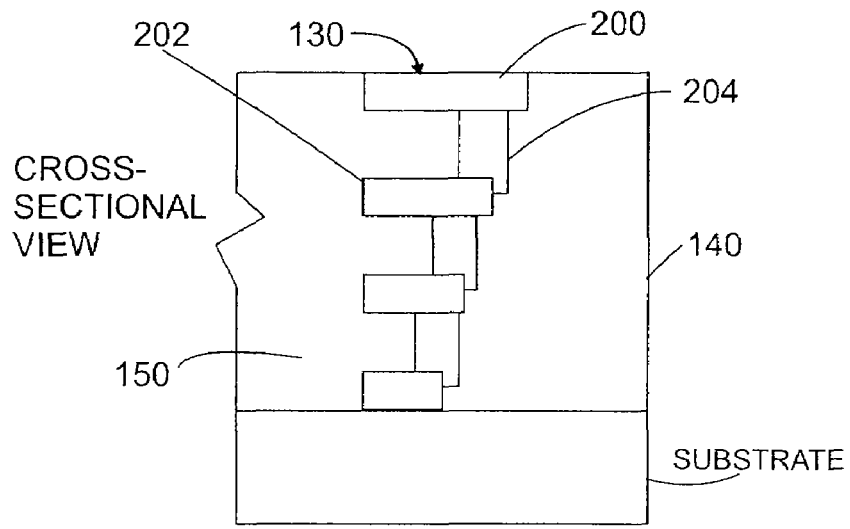
Figure 2C:
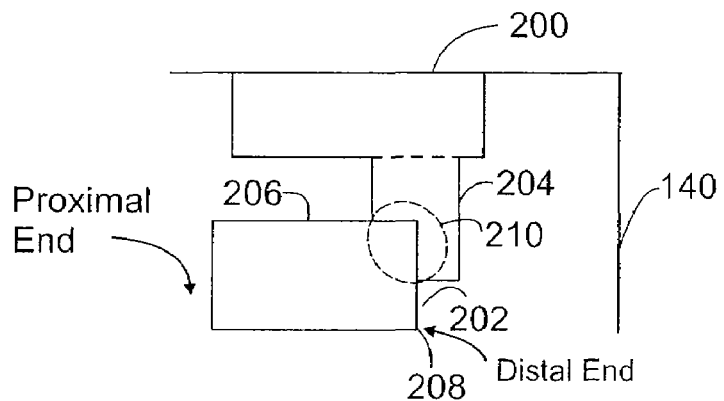

FIGS. 2A-2C illustrate a simplified diagram of a sealing structure 130 according to an embodiment of the present invention. This diagram is merely an example, which should not unduly limit the scope of the claims. One of ordinary skill in the art would recognize many variations, alternatives, and modifications.

Sealing structure 130 can include a plurality of metal traces, such as metal traces 200, 202, which are interconnected by one or more vias, such as via 204. In an embodiment of the present invention, a sealing structure includes two or more metal trace layers (e.g., five, ten, or more metal layers). Metal traces can include copper, aluminum, tungsten, polysilicon, or combinations thereof. In a specific embodiment of the present invention, metal traces can have a width ranging from about 2 microns to about 200 microns, and preferably about 10 microns to about 50 microns. Vias can also include copper, aluminum, tungsten, polysilicon, or combinations thereof. The metal traces and vias of sealing structure 130 are organized to form a vertical protective wall or continuous barrier though dielectric layer 150 to protect against stresses (such as mechanical shocks, environment conditions, and the like) originating from, or through, sawing trace 140.

Referring to FIG. 2C, metal trace 202 underlies at least a portion of metal trace 200. Via 204 couples metal trace 200 to trace 202 to create the protective wall in insulating layer 150. In one embodiment of the present invention, via 204 is coupled to at least two orthogonal surfaces of metal trace 202 (for example, top surface 206 and distal surface 208). Metal traces 200, 202 and via 204 thus form a portion of the protective wall, which is generally less susceptible to delamination, cracking, or chipping. Interface 210 between via 204 and trace 206 is better able to withstand stresses coming from sawing trace 140. Preferably, via 204 is directly coupled to at least 20% of the top surface 206, and at least 10% of the distal surface 208. As the bottom surface of via 204 is not entirely affixed to top surface 206, it is as least partially unlanded. In alternative embodiment, a via can be completely unlanded.

Figure 3:
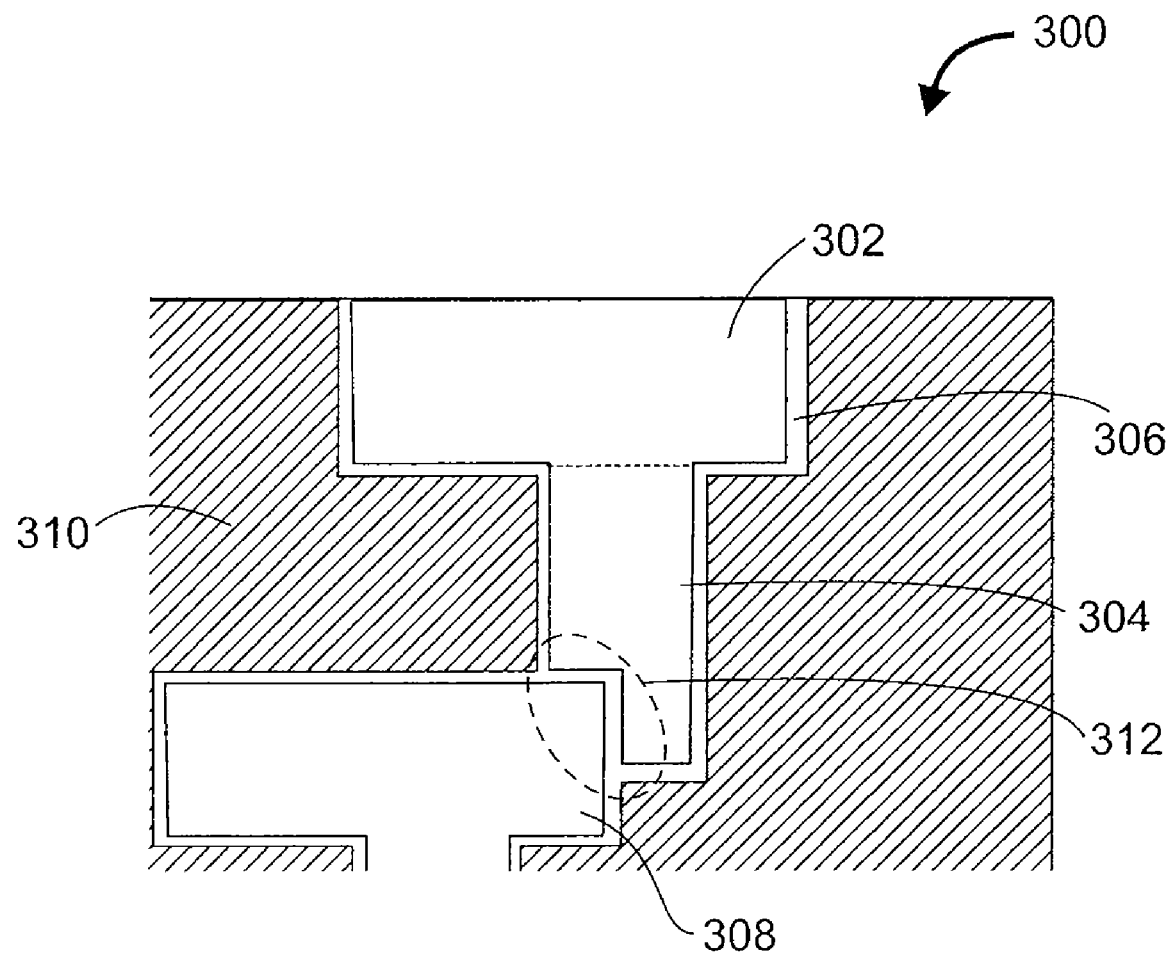
FIG. 3 illustrates a simplified diagram of a seal structure according to an embodiment of the present invention.

FIG. 3 illustrates a simplified diagram of a sealing structure 300 according to an embodiment of the present invention. This diagram is merely an example, which should not unduly limit the scope of the claims. One of ordinary skill in the art would recognize many variations, alternatives, and modifications.

Sealing structure 300 may include a barrier layer 306 disposed between metal materials of structure 300 (such as, via 304, metal layers 302, 308) and dielectric 310. Barrier layer 306 protects these metal materials, particularly copper, from corrosion due to contact with dielectric 310. In a specific embodiment, barrier layer 306 can include tantalum (Ta) and/or tantalum nitride (TaNi). As a byproduct of manufacturing processes, barrier layer 306 can also exist between a via 304 and metal layer 308. In a conventional sealing ring, the presence of a barrier layer between a via and metal layer would weaken the bonding strength of the interface therebetween. However, sealing structure 300 mitigates, or eliminates, bonding weakness associated with a barrier layer 306 at interface 312 by its construction.

Formation of sealing structure 300 can be compatible with conventional process technology without substantial modifications to conventional equipment and processes. Specifically, shaping a slot used for each layer of the sealing structure 300 can be accomplished using an underlying metal trace in sealing structure 300 as a etch stop for at least a portion of the slot. The unlanded portion of a via will thus have a deeper slot.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device, the device comprising:
   a semiconductor substrate;
   an integrated circuit;
   a dielectric layer;
   a sealing structure surrounding the integrated circuit and disposed within the dielectric layer to prevent damage to the integrated circuit, the sealing structure comprising:
   a plurality of metal traces organized in vertical layers; and
   a plurality of vias, each via of the plurality of vias couples at least two metal traces of the plurality of metal traces from adjacent vertical layers, and each via of the plurality of vias contacts at least two orthogonal surfaces of a lower metal trace of the at least two metal traces, and
   a barrier layer between the dielectric layer and each of the plurality of metal traces and plurality of vias,
   wherein the plurality of metal traces and plurality of vias form a continuous boundary in the dielectric layer.

2. The device of claim 1 wherein the dielectric layer comprises at least one of PECVD silicon oxide, silicon nitride, silicon oxynitride, silicon carbide, flowable oxide, BPSG, BSG, PSG, carbon doped silicon oxide, Black Diamond low k film, Corel CVD dielectric, SiLK dielectric resin, and Aurora low-k dielectric.

3. The device of claim 1 wherein the sealing structure forms at least one of a square, rectangle, rounded corner rectangle, oval, circle, and polyon around the integrated circuit.

4. The device of claim 1 further comprising a buffer region in the dielectric layer between the integrated circuit and the sealing structure.

5. The device of claim 4 wherein the buffer region extends at least about 1 micron.

6. The device of claim 1 wherein the plurality of metal traces each comprises at least one of copper, aluminum, tungsten, and polysilicon.

7. The device of claim 1 wherein the plurality of vias each comprises at least one of copper, aluminum, tungsten, and polysilicon.

8. An integrated circuit device, the device comprising:
   a semiconductor substrate;
   an integrated circuit;
   a dielectric layer; and
   a sealing structure surrounding the integrated circuit and disposed within the dielectric layer to prevent damage to the integrated circuit, the sealing structure comprising:
   a plurality of metal traces organized in vertical layers; and
   a plurality of vias, each via of the plurality of vias couples at least two metal traces of the plurality of metal traces from adjacent vertical layers, and each via of the plurality of vias contacts at least two orthogonal surfaces of a lower metal trace of the at least two metal traces,
   wherein the plurality of vias each directly couple to at least 20% of a top surface of the two orthogonal surfaces and wherein the plurality of metal traces and plurality of vias form a continuous boundary in the dielectric layer.

9. The device of claim 8 wherein the plurality of vias each directly couple to at least 10% of a second surface of the two orthogonal surfaces.

10. The device of claim 1 wherein the barrier layer comprises at least one of Ta and TaNi.

11. The device of claim 1 wherein the sealing structure is a first sealing structure, and a second sealing structure is disposed between the first sealing structure and the integrated circuit.

12. The device of claim 1 wherein a portion of the sealing structure abuts a sawing trace.

13. The device of claim 1 wherein the sealing structure is disposed about 0 microns to about 10 microns from a sawing trace.

14. An integrated circuit device, the device comprising:
   a semiconductor substrate;
   an integrated circuit;
   a dielectric layer;
   a sealing structure surrounding the integrated circuit and disposed within the dielectric layer, the sealing structure comprising:
   a first metal trace;
   a second metal trace, the second metal trace underlying a portion of the first metal trace; and
   a via coupling the first metal trace to the second metal trace, and
   a barrier layer between the dielectric layer and each of the first metal trace, second metal trace, and the via,
   wherein the via is coupled to a first surface of the second metal trace and a second surface of the second metal trace, and
   the first surface and the second surface are orthogonal.

15. The device of claim 14 wherein the barrier layer comprises at least one of Ta and TaNi.

16. The device of claim 14 wherein the dielectric layer comprises at least one of PECVD silicon oxide, silicon nitride, silicon oxynitride, silicon carbide, flowable oxide, BPSG, BSG, PSG, carbon doped silicon oxide, Black Diamond low k film, Corel CVD dielectric, SiLK dielectric resin, and Aurora low-k dielectric.

17. The device of claim 14 wherein the sealing structure forms at least one of a square, rectangle, rounded corner rectangle, oval, circle, and polyon around the integrated circuit.

18. The device of claim 14 further comprising a buffer region in the dielectric layer between the integrated circuit and the sealing structure.

19. The device of claim 18 wherein the buffer region extends at least about 1 micron from the integrated circuit and the sealing structure.

20. The device of claim 14 wherein the first metal trace, second metal trace, and via each comprises at least one of copper, aluminum, tungsten, and polysilicon.

21. An integrated circuit device, the device comprising:
   a semiconductor substrate
   an integrated circuit
   a dielectric layer;
   a sealing structure surrounding the integrated circuit and disposed within the dielectric layer, the sealing structure comprising:
   a first metal trace;
   a second metal trace, the second metal trace underlying a portion of the first metal trace; and
   a via coupling the first metal trace to the second metal trace, and
   wherein the via is coupled to a first surface of the second metal trace and a second surface of the second metal trace, the first surface and the second surface being orthogonal, the via directly coupled to at least 20% of the first surface, the first surface being a top surface of the second metal trace.

22. The device of claim 21 wherein the via is directly coupled to at least 10% of the second surface, the second surface being a surface orthogonal to a top surface of the second metal trace.

23. The device of claim 14 wherein the sealing member further comprises:
   a third metal trace overlying a portion of the first metal trace; and
   a second via coupling the third metal trace to the first metal trace, wherein
   wherein the second via is coupled to a first surface of the first metal trace and a second surface of the first metal trace, and
   the first surface and the second surface are orthogonal.

24. The device of claim 14 wherein the sealing structure is a first sealing structure, and a second sealing structure is disposed between the first sealing structure and the integrated circuit.

25. The device of claim 14 wherein a portion of the sealing structure abuts a sawing trace.

26. The device of claim 14 wherein the sealing structure is disposed about 0 microns to about 10 microns from a sawing trace.

27. An integrated circuit device, the device comprising:
   a semiconductor substrate;
   an integrated circuit; and
   a sealing structure disposed around the integrated circuit, the sealing structure comprising:
      a first metal trace;
      a second metal trace, the second metal trace underlying the first metal trace;
      a via disposed between the first metal trace and second metal trace; and
      a portion of the via disposed beyond a distal surface of the second metal trace and below a top surface of the second metal trace, the distal surface and the top surface of the second metal trace being orthogonal,
   wherein the via couples a bottom surface of the first metal trace to both the top and distal surfaces and the distal of the second metal trace, the via directly coupled to at least 20% of the top surface and at least 10% of the distal surface.

28. An integrated circuit device, the device comprising:
a semiconductor substrate;
a dielectric layer;
an integrated circuit; and
a sealing structure disposed around the integrated circuit, the sealing structure comprising:
   a first metal trace;
   a second metal trace, the second metal trace underlying the first metal trace;
   a via disposed between the first metal trace and second metal trace; and
   a portion of the via disposed beyond a distal surface of the second metal trace and below a top surface of the second metal trace, the distal surface and the top surface of the second metal trace being orthogonal, and
a barrier layer between the dielectric layer, the first metal trace, the second metal trace, and the via,
wherein the via couples a bottom surface of the first metal trace to both the top and distal surfaces and the distal of the second metal trace.

* * * * *